United States Patent [19]

Ovens et al.

[11] Patent Number: 5,182,223
[45] Date of Patent: Jan. 26, 1993

[54] METHOD OF MAKING AN INTEGRATED CIRCUIT WITH CAPACITOR

[75] Inventors: Kevin M. Ovens, Plano; Jeffrey A. Niehaus, Dallas, both of Tex.

[73] Assignee: Texas Instruments Incorporated, Dallas, Tex.

[21] Appl. No.: 629,922

[22] Filed: Dec. 12, 1990

[51] Int. Cl.⁵ .............................. H01L 21/70
[52] U.S. Cl. .............................. 437/60; 437/47; 437/51; 437/904; 437/919
[58] Field of Search .............. 437/51, 904, 919; 357/23.13, 47, 60

[56] References Cited

U.S. PATENT DOCUMENTS

| | | | |
|---|---|---|---|
| 3,638,301 | 2/1972 | Matsuura | 437/904 |
| 3,999,212 | 12/1976 | Usuda | 357/23.13 |
| 4,044,373 | 8/1977 | Nomiya et al. | 437/23.13 |
| 4,739,378 | 4/1988 | Ferrari et al. | 357/23.13 |
| 4,785,202 | 11/1988 | Toyoda | 333/246 |
| 4,829,344 | 5/1989 | Berbotti et al. | 357/23.13 |

FOREIGN PATENT DOCUMENTS

| | | | |
|---|---|---|---|
| 0029864 | 9/1970 | Japan | 437/904 |
| 0171262 | 7/1989 | Japan | 357/23.13 |

*Primary Examiner*—Tom Thomas
*Attorney, Agent, or Firm*—B. Peter Barndt; Richard L. Donaldson

[57] ABSTRACT

An integrated circuit (42) is formed in a semiconductor layer (50) having a defined area. Functional circuitry (12) is formed in semiconductor layer (50) to occupy only a portion of the defined area of semiconductor layer (50), and thus defining an unoccupied area of semiconductor layer (50). A capacitor is formed in semiconductor layer in a substantial portion of the unoccupied area.

5 Claims, 1 Drawing Sheet

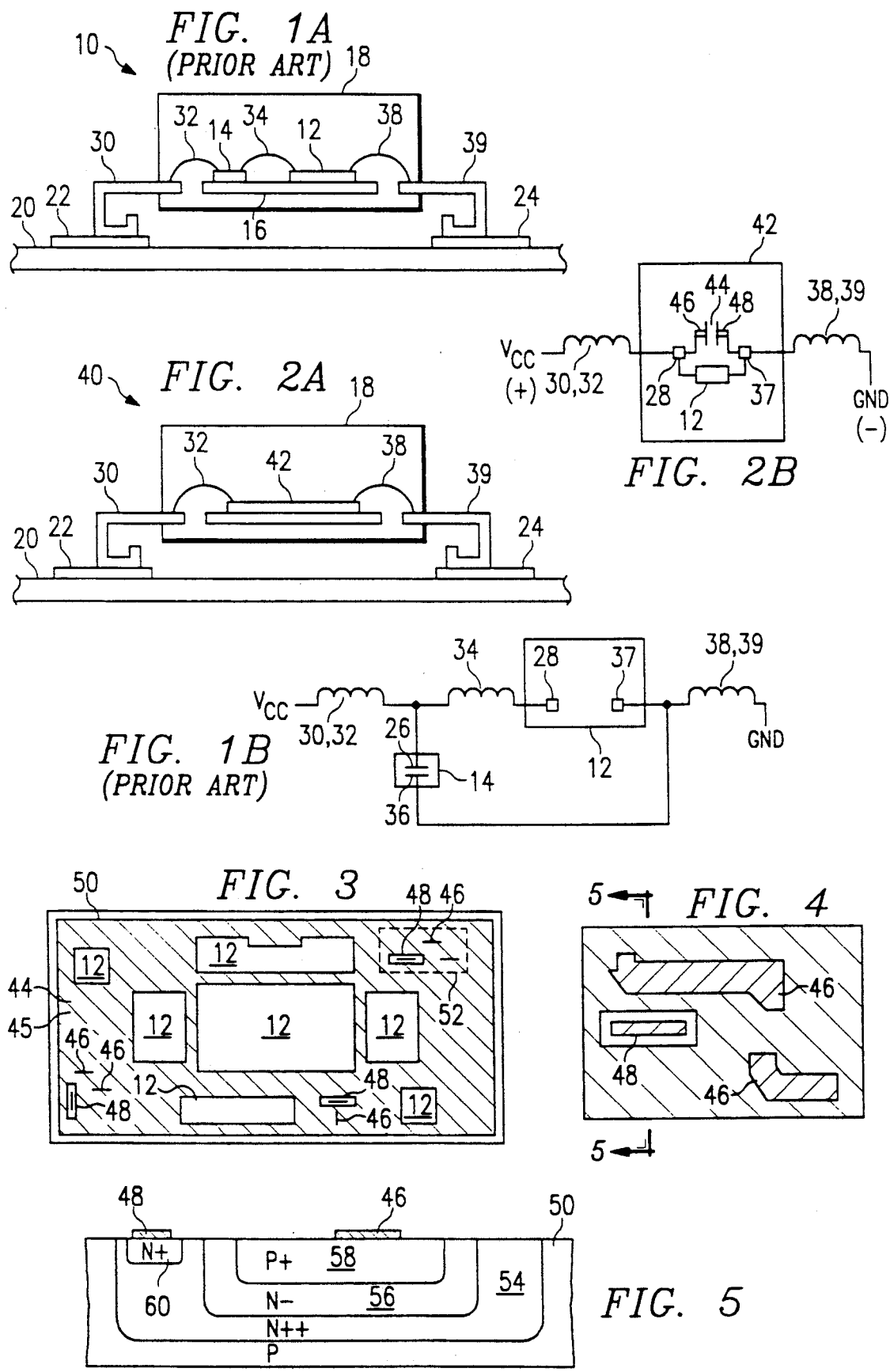

METHOD OF MAKING AN INTEGRATED CIRCUIT WITH CAPACITOR

TECHNICAL FIELD OF THE INVENTION

The present invention relates in general to electronic circuits and in particular to integrated circuits and methods for their fabrication.

BACKGROUND OF THE INVENTION

A common problem affecting the performance of integrated circuits and systems using integrated circuits is the inductance on the power input pins. At the system level, input pin inductance problems are alleviated by adding bypass capacitors between the power and ground traces on the printed circuit board adjacent the power and ground pins of the integrated circuit packages. While this eliminates the PC board inductance, the integrated circuit package inductance due to the package power input pin inductance and the inductance of the bond wire coupling the power input pin to the integrated circuit remains. These package inductances may range from 3 nH to over 20 nH, depending on the package type, the number and type of pins used for power input and the number and spacing of the associated bond wires.

When the outputs of an integrated circuit switch, internal spikes of one ampere or higher may be encountered, lasting from one to two nanoseconds. These spikes result in a change of input current between 0.5 to 1.5 amp/ns. The change in input current can result in a significant voltage drop across the inductance of the power input pin and associated bond wire as a function of their inductance, since the voltage across an inductor behaves according to the formula $V_L = L \, di(t)/dt$ where $V_L$ is the voltage across the inductor, $L$ is the inductance and $di/dt$ is the change in current with time through the inductor. As an example, a twenty-eight pin package having an input power pin with an inductance of 8 nH switching at a rate of 0.5 amp/ns will develop a four volt drop across the power input pin. Such a drop is not practical for an integrated circuit operating on a 5 volt nominal power supply.

One method of reducing the voltage drop across the power input inductance is to reduce the rate at which the output switches the associated output loads. In the example given above, if the output switching rate is reduced, such that the input power switches at a reduced rate of 0.125 amps/ns, the voltage drop across the power input inductance can be reduced to 1 volt. This method has serious disadvantages in that the performance of the integrated circuit has been degraded since the output switching rate has been reduced, which may be unacceptable in many applications. Further, a voltage drop is still present which reduces the voltage available for the functional circuitry.

A second method used to help solve the problems of inductance on the input power pins is to add a power to ground bypass capacitor in the integrated circuit package during the mounting and bonding procedure. These discrete capacitors are commonly known as "chip" capacitors which effectively couple the power and ground pins so that the switching current is passed through both the inductors created by the power input pin and the ground pin, thereby cancelling the loss through the power input pin. A number of disadvantages are inherent with this method, however. The assembly cost is increased due to the additional steps of mounting and bonding the added capacitor. The reliability of the overall integrated circuit package may be significantly reduced since the added capacitor is usually less reliable then the associated integrated circuit. Further, the lower cost capacitors, which would be desirable for use in a highly competitive market, do not have the frequency response needed and may even add an additional 2 nH or more of series inductance themselves. When this series inductance of the bypass capacitor is added with the inductance of the bonding wires required to connect the capacitor with the associated pins, the solution becomes marginal. Finally, the internal resistances from the pins, bonding wires and the capacitor itself may be high enough to adversely affect the performance of the added capacitor.

Thus, the need has arisen for apparatus and methods for reducing the inductance of the input power pins such that maximum internal voltage can be achieved while maintaining fast output current switching speed and high reliability.

SUMMARY OF THE INVENTION

According to the invention, an integrated circuit is provided on a semiconductor layer. Functional circuitry is formed in the semiconductor layer such that the functional circuitry occupies a first portion of the semiconductor layer. A capacitor is formed in a second portion of the semiconductor layer not used by the functional circuitry.

According to further aspects of the invention, the capacitor is a bypass capacitor comprising a diode having a substantial inherent capacitance. The diode includes an cathode coupled to the relative positive voltage supply terminal of the integrated circuit and an anode coupled to the relative negative voltage supply terminal of the integrated circuit.

The present invention provides significant advantages over the prior art apparatus and methods for reducing the effect power input inductance. Since the capacitor is distributed through the unoccupied areas of the semiconductor layer on which the integrated circuit is formed, the effect of inductance of the power pins and associated bonding wire can be reduced to as little as 0.1 to 0.2 nH. The reduced effects of the power input capacitance allows for faster switching speeds internal to the circuit and at the outputs. Additionally, by utilizing a large number of contacts to the distributed capacitance, the resistance of the bypass capacitor can be substantially reduced. Further, the bypass capacitor can be formed simultaneously with the fabrication of the function circuitry of the integrated circuit, thereby providing for fabrication process efficiency without substantially increased costs. Finally, the reliability of the bypass capacitor is in essence the same as the semiconductor devices making up the functional circuitry, thereby providing a distinct advantage over prior art integrated circuits utilizing less reliable discrete capacitors.

BRIEF DESCRIPTION OF THE DRAWINGS

Other aspects of the invention and their advantages will be discerned when one refers to the following detailed description as taken in conjunction with the drawings, in which like numbers identify like parts, and in which; FIGS. 1A–1B are respective mechanical and electrical schematic diagrams of a prior art packaged integrated circuit utilizing a discrete bypass capacitor;

FIGS. 2A-2B are respective mechanical and electrical schematic diagrams of a packaged integrated circuit utilizing a distributed bypass capacitor according to the invention;

FIG. 3 is a top plan view showing a typical device layout of an integrated circuit according to the invention;

FIG. 4 is an expanded top plan view of a portion of the integrated circuit shown in FIG. 3; and FIG. 5 is an elevational sectional view taken substantially along lines 5—5 of FIG. 4.

DETAILED DESCRIPTION OF THE INVENTION

Referring first to FIGS. 1A and 1B, which are respective mechanical and electrical schematic drawings of a prior art packaged integrated circuit 10, including the integrated circuit 12 and an associated bypass capacitor 14 mounted in a package 18. Integrated circuit 12 includes the desired functional circuitry, which may be either digital circuitry, such as programmable array logic, or linear circuitry, such as an operational amplifier. Capacitor 14 is a discrete capacitor which may be a chip capacitor as known in the art. Capacitor 14 and integrated circuit 12 are mounted on a mounting surface 16, also known in the art.

Packaged integrated circuit 10 is shown mounted on a printed circuit board 20 which includes a power ($V_{cc}$) line or trace 22 coupled to a relative positive voltage supply and a line or trace 24 coupled to a relative negative voltage or supply ground. The first plate 26 of capacitor 14 and the $V_{cc}$ input pad 28 of integrated circuit 12 are coupled to $V_{cc}$ trace 22 through $V_{cc}$ pin 30 and bonding wires 32 and 34.

Pin 30 and bonding wires 32 and 34 are depicted as their inductances in the electrical schematic of FIG. 1B. The second plate 36 of capacitor 14 is coupled to ground or a relative negative voltage through mounting surface 16 and bonding wire 38 as known in the art. Pad 37 of integrated circuit 12 is also coupled through bonding wire 38 to ground or a relative negative power supply, which is represented as its inductance in the electrical schematic of FIG. 1B.

As discussed above, the prior art packaged integrated circuit 10 has significant disadvantages in that it employs a discrete capacitor 14 which has inherent reliability and packaging problems and which also requires the additional inductive bonding wire 34.

Referring next to FIGS. and 2A and 2B, a packaged integrated circuit 40, according to the present invention, is shown as respective mechanical and electrical schematics. For correspondence with the devices shown in FIGS. 1A and 1B, like parts have like numbers. In the present invention, discrete capacitor 14 has been eliminated and instead, the required capacitance is found as a distributed capacitance integral with integrated circuit 42 The functional circuitry 12, shown in the electrical schematic representation of FIG. 2B, is essentially the same as that comprising integrated circuit 12 in the prior art device of FIGS. 1A and 1B. The bypass capacitor 44, however, has now been formed on the same semiconductor layer functional circuitry 12. As discussed below, bypass capacitor 44 is distributed across the area of integrated circuit 42 not required for the fabrication of functional circuitry 12 and includes a number of relative positive voltage supply terminals 46 and relative negative voltage supply terminals 48, a pair of each which are shown in FIG. 2B, as an example.

Referring next to FIG. 3, a stylized plan view of an integrated circuit 42 is shown fabricated on a semiconductor layer 50, according to the invention. The functional circuitry is disposed in the areas 12 of substrate 50. In an actual implementation, these areas 12 may be much more complex in form, depending on the actual layout of the circuitry, and thus are greatly simplified in FIG. 3 for clarity. Further; circuitry such as interconnecting metalization, bonding wires and pads have not been shown for clarity.

Capacitor 44 is distributed across the face of semiconductor layer 50 as shown by the cross-hatched areas at 45. Again, in actual implementation, distributed capacitor 44 may take on a much more complex shape, depending on the area available following definition of the layout of the functional circuitry 12. A number of contacts 46 and 48 are depicted by way of example. In actual implementation, there may be one hundred or more of each of the contacts 46 and 48. The resistance associated with capacitor 44 can be reduced by providing a large number of such contacts.

FIGS. 4 and 5 depict respective plan and cross-sectional elevational views of an area 52 which comprises a portion of the capacitor 44, shown by dotted lines in FIG. 3. Capacitor 44 is in essence a capacitive diode which may be formed concurrently with the formation of the required transistors and diodes in functional circuitry 12. In the preferred embodiment, semiconductor layer 50 is a layer of p type material. A layer 54 of heavily doped n type material (n++) (typically in the range of $1-5 \times 10^{20}$ cm$^{-3}$) is formed in semiconductor 50 to form the cathode of the diode. A second layer 56 of n type material (n−) (typically in the range of $5 \times 10^{18} - 1 \times 10^{19}$ cm$^{-3}$) with a lighter dopant concentration than the dopant concentration of layer 54 is formed in layer 54 to provide a graded junction controlling the resistance of the diode. The thickness of layer 56 may further be selected to adjust the capacitance. Typically, the thickness of layer 56 will be on the order of 2000 angstroms to provide 300–500 pF of capacitance for a twenty-eight pin device 5V having typical unused space for fabricating capacitor 44. A layer 58 of heavily doped p type material (p+)(typically in the range of $1 \times 10^{19}$ cm$^{-3}$) is formed in n type layer 56 to form the anode of the diode. Metal contact 46 is then formed to contact anode 58 while metal contact 48 is made to cathode region 54. In a preferred embodiment, an n+ doped region 60 may be provided adjacent contact 48 to control the contact resistance with cathode layer 54.

Capacitor 44 can be fabricated across the substantial area of semiconductor layer 50 not utilized for functional circuitry 12 providing greater capacitance than a lumped device. Further, capacitor 44, being a semiconductor diode with an inherent capacitance, can be fabricated simultaneously with the transistors and diodes needed in functional circuitry 12. For example, area 54 may be simultaneously formed with the creation of the collector regions of transistors which may be required in functional circuitry 12. Region 58 may be fabricated simultaneously with the creation of the base regions of the same transistors. By utilizing substantially all of the area of semiconductor layer 50 not necessary for the creation of functional devices, bypass capacitor 44 may typically have a capacitance in the range of 300 to 500 picofarads, allowing a significant reduction in the effect of the inductance of the input power pins and the associated bonding wires. By using a large number of contacts 46 and 48, the resistance of capacitor 44 can be substantially reduced, further improving performance.

The present invention provides significant advantages since with simultaneous fabrication with the functional devices 12, the assembly cost of the overall package is unaffected. At the same time, the reliability remains the same as the remainder of the devices forming the integrated circuit. Further, since the capacitor is distributed, the input inductance of the power pins and associated bonding wires may be reduced to as little as 0.1 to 0.2 nH, allowing the switching speed to be significantly increased. Finally, the distributed capacitance, especially when employed with a large number of contacts, has negligible resistance.

While preferred embodiments of the invention and their advantages have been set forth in the above-detailed description, the invention is not limited thereto, but only by the scope and spirit of the appended claims.

What is claimed is:

1. A method of fabricating an integrated circuit comprising the steps of:
   forming a layer of semiconductor;
   fabrication functional circuitry in the semiconductor layer such that the functional area occupies only a first portion of the semiconductor layer of the semiconductor layer; and
   forming a capacitor in a second remaining portion of the semiconductor layer not used to form the functional circuitry, to provide a capacitor across the area of the semiconductor layer not utilized by the functional circuitry.

2. The method of claim 1, wherein said step of forming a capacitor comprises the step of forming a diode having an anode and a cathode in said unoccupied area of said semiconductor layer.

3. The method of claim 2 and further comprising the steps of:
   coupling the anode of the diode to the relative negative voltage supply terminal of the integrated circuit; and
   coupling the cathode of the diode to the relative positive voltage supply terminal of the integrated circuit.

4. The method of fabricating an integrated circuit having an integrated bypass capacitor comprising the steps of:
   forming a layer of semiconductor of a first conductivity type to have a defined area;
   forming functional circuitry in said layer of semiconductor to occupy only a portion of the defined area and thus defining an unoccupied area of the layer of semiconductor;
   forming a diode cathode in the layer of semiconductor of a layer of heavily doped material of a second conductivity type opposite the first conductivity type;
   forming an intermediate layer in the cathode of a layer of doped material of the second conductivity type, such that the dopant concentration of the intermediate layer is substantially less than the dopant concentration of the cathode;
   forming an anode in the intermediate layer of a layer of heavily doped material of the first conductivity type;
   forming a plurality of metal contacts to said cathode;
   forming a plurality of metal contacts to said anode;
   coupling the plurality of metal contacts to the cathode to at least one power input terminal; and
   coupling the plurality of metal contacts to the anode to at least one ground terminal of the integrated circuit.

5. A method of fabricating an integrated circuit comprising the steps of:
   forming a layer of semiconductor material;
   fabricating at least one semiconductor device in the semiconductor layer such that the semiconductor device occupies only a first portion of the semiconductor device occupies only a first portion of the semiconductor layer; and
   forming a capacitor in and through out the remaining portion of the semiconductor layer not used to form said at least one semiconductor device, to provide a capacitor across and through out the area of the semiconductor layer not utilized by the at least on semiconductor device.

* * * * *